Figure 1:
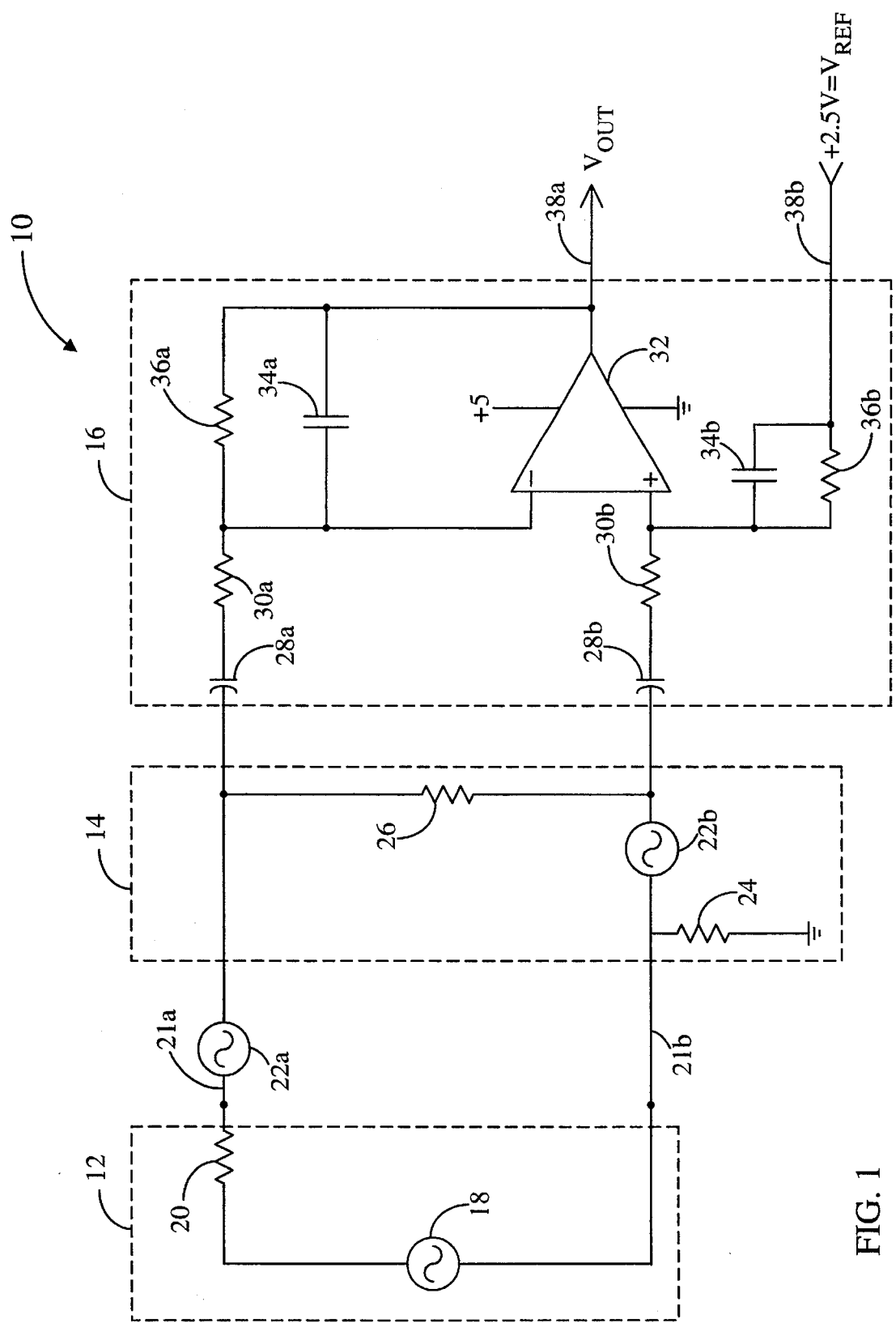

United States Patent [19]

Heyl

[11] Patent Number: 5,517,572
[45] Date of Patent: May 14, 1996

[54] METHODS AND APPARATUS FOR CONNECTING AND CONDITIONING AUDIO SIGNALS

[75] Inventor: Lawrence F. Heyl, Mountain View, Calif.

[73] Assignee: Apple Computer, Inc., Cupertino, Calif.

[21] Appl. No.: 72,730

[22] Filed: Jun. 7, 1993

[51] Int. Cl.⁶ .................................................. H04B 15/00
[52] U.S. Cl. .............................. 381/94; 381/120; 333/32
[58] Field of Search ............................ 381/94, 28, 120; 330/258, 149; 333/32, 24 R, 4, 327

[56] References Cited

U.S. PATENT DOCUMENTS

| 4,243,839 | 1/1981 | Takahashi et al. | 381/96 |
| 4,386,378 | 5/1983 | Guisinger | 360/46 |
| 5,146,506 | 9/1992 | Sasaki | 381/94 |

FOREIGN PATENT DOCUMENTS

| 0482291A1 | 4/1992 | European Pat. Off. | H03F 3/181 |
| 0500037 | 8/1992 | European Pat. Off. | 381/94 |
| 61-65610(A) | 4/1986 | Japan | H03F 3/00 |

OTHER PUBLICATIONS

Horst Zander, "Zur Unterdrückung von Gleichtaktignalen", Fernseh and Kino Technik, vol. 37, No. 9, Sep., 1983, Berlin, Germany, pp. 368–374.

IC Op-Amp Cookbook, Walter G. Jung, Second Edition First Printing—1980, pp. 36–39.

*Primary Examiner*—Curtis Kuntz
*Assistant Examiner*—Huyen D. Le
*Attorney, Agent, or Firm*—Leo V. Novakoski

[57] ABSTRACT

Audio signal connection and conditioning circuitry employs a resistive drop across the ground input for the signal source to generate a common mode voltage on both input lines. A differential amplifier subtracts the generated common mode voltage on the ground line from the common mode voltage on the source input line, leaving only the source voltage as an output. The differential amplifier output is generated with respect to a positive, stable voltage reference instead of a floating ground.

13 Claims, 1 Drawing Sheet

METHODS AND APPARATUS FOR CONNECTING AND CONDITIONING AUDIO SIGNALS

1. CROSS-REFERENCE TO RELATED PATENT APPLICATIONS

This patent application is related to the patent application entitled "Audio Peripheral Mixer Circuit and Method for Noise Reduction" by David Franklin Wilson and Lawrence Frederick Heyl, filed May 13, 1993, patent application Ser. No. 08/062,422 and assigned to Apple Computer, Inc., the disclosure of which is hereby incorporated by reference.

2. FIELD OF THE INVENTION

The present invention relates to electronic amplifier systems. In particular the invention relates to connecting a source of audio signals to a computer system.

3. BACKGROUND OF THE INVENTION

With increasing sophistication, personal computers interact with users through a variety of multi-media apparatus and techniques. In particular, desktop computers have begun to incorporate signals from a variety of sound sources, including microphones, tape and CD players, video inputs and telephone equipment. These sources provide sound and voice information for use by computer applications. For instance, sampling program applications can capture, store and modify voice and music information. As another example, speech recognition and synthesis programs can parse human speech and perform program commands based upon the recognized human voice. New uses for sound inputs will continue to expand computer performance.

Unfortunately, several factors hamper the use of these sound inputs in desktop computers. The desktop computer, designed for digital purposes, presents a rather hostile environment for audio frequency electronic operation. Desktop computers continuously generate digital signals having spurious electromagnetic frequency components in the audio region, creating common mode noise. In addition, series inductance and series resistance drops (IR drops) within circuit boards, connectors and cables exacerbate this common mode noise. Power mains frequencies and their principal harmonics also add to this common mode noise.

Common mode noise makes connecting two analog devices together (such as a sound input and a desktop computer on-board preamplifier) difficult. The straightforward approach connects the ground signals of the two devices together and then connects the external signal source to a suitable input point. However, because of common mode noise, ground is seldom true "ground". A floating ground, caused by coupled common mode noise, can interfere with and degrade voice and sound signals. Exposed to this interference, program applications can exhibit anomalous and often erroneous behavior. Speech recognition applications, in particular, require fairly high signal-to-noise ratios to extract recognizable words from a stream of sound data. Common mode noise degradation can hamper and even prevent proper operation of these human voice and sound applications, especially from sound sources that provide very low level signals.

Two conventional methods can be tried for connecting audio signals to a desktop computer. One simple method uses a single-ended connection, thereby connecting grounds together and simply hoping that the differences in grounds will not be significant. The other method employs complex and expensive full differential inputs to minimize common mode noise. Unfortunately, the computer industry faces significant competitive pressures to reduce costs and increase reliability and manufacturing yields. Expensive or unreliable techniques for handling common mode noise are simply not viable for most desktop computer applications.

Current apparatus and methods for connecting analog components together do not provide a simple, inexpensive approach for connecting sound inputs to a desktop computer system while minimizing floating ground and noise degradation. These conventional approaches do not provide a high-performance sound input connection and conditioning circuit that is easy to manufacture, with high yields and dependable performance. What is needed is an improved method and apparatus for connecting and conditioning audio signals for computer applications. An improved apparatus and method for connecting and conditioning audio signals should provide a simple, inexpensive and dependable approach for the inputting of sound and human voice signals. The improved apparatus and method should provide a flexible approach that easily adapts to any particular desktop computer environment, and that can be incorporated in computer circuitry with inexpensive, readily available parts.

4. SUMMARY OF THE INVENTION

In accordance with the present invention, a connecting and conditioning system for audio signals comprises an input for an audio signal, one or more resistive drops connected to the input, and a differential amplifier connected across the input, where the differential amplifier provides a conditioned audio signal output referred to a stable, quiet voltage reference.

A first resistive drop from one line of the input generates a common mode voltage, or $V_{CM}$ across both lines of the input. A second resistive drop across both lines of the input generates the actual input signal voltage drop, or $V_S$. The differential amplifier serves to subtract out the common mode voltage signal $V_{CM}$ from both input lines, leaving just $V_S$, referred to a stable voltage reference $V_{ref}$, instead of a possibly noise-corrupted ground.

With only a few active components available off-the-shelf, the unique design of the connection and conditioning system of the present invention provides inexpensive methods and apparatus for connecting sound signals to a desktop computer, or to any other electronic application requiring low-cost, high-performance audio signal connection and conditioning. The present invention can connect two audio components, significantly reduce common mode noise inherent to such electronic devices and couplings, and provide useful audio connections for desktop computer applications. The output signal of the present invention is a clean signal voltage, significantly free of any common mode voltage noise. These and other features and advantages of the present invention are apparent from the description below with reference to the following drawing.

5. BRIEF DESCRIPTION OF THE DRAWINGS

FIG. 1 shows a schematic diagram of an audio signal connection and conditioning circuit in accordance with the present invention.

6. DESCRIPTION OF THE PREFERRED EMBODIMENTS

In accordance with the present invention, an audio signal connection and conditioning circuit 10 is shown in FIG. 1.

The circuit includes a signal source 12, one or more resistive loads 14, and a differential amplifier block 16. The signal source 12 comprises a source signal 18 ($V_S$) and a source resistance 20 ($R_S$). The output of the signal source attaches to input lines 21a and 21b.

In a conventional audio signal input, a variety of sources would contribute to generate a net common mode voltage noise source across the input lines, represented by $V_{CM}$ or noise source 22a. The sources of common mode noise include power mains frequencies at 50 or 60 Hz; the first few significant harmonics of power mains frequencies (i.e., 100, 150, 200, 250 Hz or 120, 160, 240 and 300 Hz); noise created by the harmonics of digital signals; power supply noise; and any other noise inherent to the input signal source $V_S$. The present invention significantly reduces any such common mode noise across inputs 21a and 21b.

First, the present invention generates a second $V_{CM}$ across input line 21b by using resistive drop 24. Resistor 24 in the preferred embodiment is 49.9 ohms. A second resistive drop 26 across input lines 21a and 21b is 10 Kohms. By choosing resistor 24 to be greater than competing return paths on a typical circuit board implementation, $V_{CM}$ is generated on both sides of resistor 26, while $V_S$ is generated only on input line 21a. The differential amplifier, discussed further below, can then take the signal on line 21a (or $V_S+V_{CM}$) and subtract the signal found now on line 21b (or just $V_{CM}$) to yield the pure audio signal $V_S$.

Differential amplifier 16 subtracts the generated signals on input lines 21a and 21b. The core of differential amplifier 16 is operational amplifier 32, which can be an LMC660C or MC34074 or similar device. Input lines 21a and 21b are coupled to the inputs of operational amplifier 32 by two pairs of capacitors and resistors, 28a and 30a and 28b and 30b. Capacitors 28a and 28b (1.0 µF) block the reference voltage $V_{Ref}$ (one input 42b of the differential amplifier block 16), providing a unity DC gain for circuit 10. Resistors 30a and 30b were chosen to be much greater than the typical external source impedance $R_S$ (Resistance 20). Assuming a maximum $R_S$ of 1000 ohms (where typically $R_S$ will be under 100 ohms), a value of 44 Kohm for resistors 30a and 30b represents a good trade-off between negligible loading of the signal input 12 and low noise contribution to circuit 10. Resistors 30a and 30b and capacitors 28a and 28b also establish the lower cut-off frequency for the amplifier. In the preferred embodiment, this cut-off frequency was chosen to be a quite low 3.6 Hz so that common mode noise rejection would be adequate over the audio band, but especially at the power line frequencies of 50 Hz and 60 Hz. Setting the lower cut-off frequency also allows for much looser tolerance parts to be used in production, increasing manufacturing yields.

Resistors 30a and 30b, in conjunction with resistors 36a and 36b (22 Kohms), set the AC gain of the differential amplifier stage, simply defined as:

$$AC\_GAIN = \frac{R_{36a}}{R_{30a}} = \frac{R_{36b}}{R_{30b}} = \frac{22}{44} = 0.5$$

Thus, given the values of the preferred embodiment, circuit 10 has an AC gain of –0.5, and a DC gain of 1.0. Output 38a of the differential amplifier 16 provides $V_S$, while input 38b is provided a stable, quiet +2.5 V. reference, instead of an unstable, floating ground.

In addition, resistors 30a, 30b, 36a and 36b are constructed as a resistor network, for stability of circuit operation combined with an economy of parts. Also, since resistor 26 is much greater than either resistance 20 ($R_S$) or resistor 24, resistors 24 and 26 have a negligible effect on the AC gain of circuit 10. When $R_S$ tends towards 0 ohms, circuit 10 will achieve up to 54 dB rejection of common mode noise. With $R_S$= 1000 ohms, common mode rejection degrades to 40 dB. Capacitors 34a and 34b roll off the high frequency response of operational amplifier 32, such that with a common mode rejection of –3 dB at 27 kHz, the common mode rejection of circuit 10 stays relatively flat within ±2 dB from 20 Hz to 20 kHz.

While the present invention has been described with reference to preferred embodiments, those skilled in the art will recognize that various modifications may be provided. A number of equivalent apparatus can be used to implement the present invention. For example, any number of equivalent components can be substituted for the operational amplifier, capacitors and resistors. These and other variations upon and modifications to the described embodiments are provided for by the present invention, the scope of which is limited only by the following claims.

What is claimed is:

1. An apparatus for connecting and conditioning an audio signal from a floating signal source using a differential amplifier having an output and first and second inputs characterized by input and common mode input impedances, the apparatus comprising:

an audio signal input having first and second input lines for receiving the audio signal from the floating signal source;

a first input resistive drop, external to the differential amplifier, between the first input line of the audio signal input and a ground reference; and a second input resistive drop, external to the differential amplifier, between the first and second input lines, the first and second input lines being coupled to the first and second inputs, respectively, of the differential amplifier and the first and second input resistive drops being substantially smaller than the input and common mode input impedances of the differential amplifier.

2. The apparatus as claimed in claim 1 further comprising:

a first resistor connected in series with a first capacitor for coupling the first input line of the audio signal input to the first input of the differential amplifier; and a second resistor connected in series with a second capacitor for coupling the second input line of the audio signal input to the second input of the differential amplifier.

3. The apparatus as claimed in claim 2 further comprising:

a third resistor connected in parallel with a third capacitor for coupling the output of the differential amplifier to the second input of the differential amplifier.

4. The apparatus as claimed in claim 3 further comprising a fourth resistor connected in parallel with a fourth capacitor for coupling a stable voltage reference to the first input of the differential amplifier.

5. The apparatus as claimed in claim 4, wherein the first resistive drop is created by a resistor having a resistance of between 10 ohms and 100 ohms and wherein the second resistive drop is created by a resistor having a resistance of between 5 K ohms and 50 K ohms.

6. The apparatus as claimed in claim 5, wherein the first resistive drop is created by a resistor having a resistance of approximately 50 ohms and the second resistive drop is created by a resistor having a resistance of approximately 10 K ohms.

7. The apparatus as claimed in claim 6, wherein the third and fourth resistors each have resistances of between 10 Kohms and 100 Kohms and the third and fourth capacitors each have capacitances of between 0.1 µF and 10 µF.

8. The apparatus as claimed in claim 7, wherein the third and fourth resistor each have resistances of approximately 44 Kohms and the third and fourth capacitors each have capacitances of approximately 1 μF.

9. An apparatus for connecting and conditioning an audio signal from a floating source using a differential amplifier having an output and first and second inputs characterized by input and common mode input impedances, the apparatus comprising:

a first resistor serially connected between the first terminal of the differential amplifier and a first terminal of a first capacitor to form a first input line of an audio signal input at a second terminal of the first capacitor;

a second resistor serially connected between the second input of the differential amplifier and a first terminal of a second capacitor to form a second input line of the audio signal input at the second terminal of the second capacitor;

a first resistive drop, external to the differential amplifier, between the second terminal of the first capacitor and a ground reference;

a second resistive drop, external to the differential amplifier between the second terminals of the first and second capacitors, the first and second input resistive drops being substantially smaller than the input and common mode input impedances of the differential amplifier;

a third resistor connected in parallel with a third capacitor coupling the output of the differential amplifier to the second input of the differential amplifier;

a stable voltage reference; and a fourth resistor connected in parallel with a fourth capacitor coupling the stable voltage reference to the first input of the differential amplifier.

10. A method for connecting and conditioning an audio signal using a differential amplifier having an output and first and second inputs characterized by input and common mode input impedances, the apparatus comprising:

coupling the audio signal across first and second input lines;

creating a first input resistive drop, external to the differential amplifier and substantially smaller than the input and common mode input impedances of the differential amplifier, between the first input line and a ground reference to transform audio noise to a common mode voltage signal on the input lines;

creating a second resistive drop, external to the differential amplifier and substantially smaller than the input and common mode input impedances of the differential amplifier, between the first and second input lines to generate an input voltage signal on the second input line from the audio signal applied across the first and second input lines;

coupling the common mode and input voltage signals on the first and second input lines to the first and second inputs of the differential amplifier; and subtracting out the common mode voltage signal from the input voltage signal using the differential amplifier, to provide a conditioned audio signal at an output of the differential amplifier.

11. The method of claim 10 wherein coupling common mode and input voltage signals comprises:

coupling the common mode voltage signal on the first input line to the first input of the differential amplifier using a first resistor serially connected to a first capacitor; and coupling the common mode and input voltage signals on the second input line to the second input of the differential amplifier using a second resistor serially connected to a second capacitor.

12. The method as claimed in claim 11, further comprising:

coupling the conditioned audio signal at the output of the differential amplifier to the second input of the differential amplifier through a third resistor connected in parallel with a third capacitor.

13. The method as claimed in claim 12 further comprising:

coupling a non-ground voltage reference to the first input of the differential amplifier using a fourth resistor connected in parallel with a fourth capacitor.

* * * * *